US010297593B2

(12) United States Patent
Gejo

(10) Patent No.: US 10,297,593 B2
(45) Date of Patent: May 21, 2019

(54) SEMICONDUCTOR DEVICE

(71) Applicant: Kabushiki Kaisha Toshiba, Minato-ku, Tokyo (JP)

(72) Inventor: Ryohei Gejo, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 319 days.

(21) Appl. No.: 15/006,790

(22) Filed: Jan. 26, 2016

(65) Prior Publication Data
US 2016/0218101 A1 Jul. 28, 2016

(30) Foreign Application Priority Data

Jan. 28, 2015 (JP) .................................. 2015-014168

(51) Int. Cl.
| | | |
|---|---|---|
| *H01L 29/739* | (2006.01) | |
| *H01L 27/07* | (2006.01) | |
| *H01L 29/08* | (2006.01) | |
| *H01L 29/861* | (2006.01) | |
| H01L 27/06 | (2006.01) | |
| H01L 29/36 | (2006.01) | |
| H01L 29/40 | (2006.01) | |

(52) U.S. Cl.
CPC ...... *H01L 27/0727* (2013.01); *H01L 29/0834* (2013.01); *H01L 29/7397* (2013.01); *H01L 29/8613* (2013.01); H01L 27/0629 (2013.01); H01L 29/36 (2013.01); H01L 29/407 (2013.01)

(58) Field of Classification Search
CPC .......................... H01L 29/739; H01L 29/1095

USPC .................................................. 257/140, 143
See application file for complete search history.

(56) References Cited

U.S. PATENT DOCUMENTS

| | | | |
|---|---|---|---|
| 9,214,535 B2 | 12/2015 | Matsudai et al. | |
| 2003/0146493 A1 | 8/2003 | Tomomatsu | |
| 2006/0273402 A1 | 12/2006 | Khemka et al. | |
| 2007/0194346 A1 | 8/2007 | Nagase et al. | |
| 2009/0283799 A1* | 11/2009 | Ruething | H01L 29/0834 257/143 |
| 2010/0301386 A1 | 12/2010 | Lin et al. | |
| 2012/0181575 A1 | 7/2012 | Pfirsch | |
| 2012/0299108 A1 | 11/2012 | Harada et al. | |
| 2014/0070266 A1 | 3/2014 | Matsudai et al. | |
| 2014/0084337 A1 | 3/2014 | Matsudai et al. | |
| 2015/0132895 A1* | 5/2015 | Kamijo | H01L 29/66333 438/138 |
| 2015/0179636 A1* | 6/2015 | Pfirsch | H01L 29/7397 257/140 |
| 2015/0179637 A1 | 6/2015 | Pfirsch et al. | |

(Continued)

FOREIGN PATENT DOCUMENTS

| | | |
|---|---|---|
| CN | 102593168 A | 7/2012 |
| CN | 104733519 A | 6/2015 |
| JP | 2008-047565 A | 2/2008 |

(Continued)

*Primary Examiner* — Moazzam Hossain
*Assistant Examiner* — Hajar Kolahdouzan
(74) *Attorney, Agent, or Firm* — White & Case LLP

(57) ABSTRACT

According to one embodiment, a semiconductor device includes a first region having an insulated gate bipolar transistor and a second region having a diode. The first region and the second region are formed in a same chip. A breakdown voltage of the second region is lower than a breakdown voltage of the first region.

2 Claims, 6 Drawing Sheets

(56) References Cited

U.S. PATENT DOCUMENTS

2016/0211257 A1   7/2016   Yoshida

FOREIGN PATENT DOCUMENTS

| | | |
|---|---|---|
| JP | 2010-114248 A | 5/2010 |
| JP | 2011-243694 A | 12/2011 |
| JP | 2015-032689 A | 2/2015 |
| JP | 2016-131224 A | 7/2016 |
| TW | 200644236 A | 12/2006 |
| TW | I402985 B | 7/2013 |

* cited by examiner

SEMICONDUCTOR DEVICE

CROSS-REFERENCE TO RELATED APPLICATION

This application is based upon and claims the benefit of priority from Japanese Patent Application No. 2015-014168, filed Jan. 28, 2015, the entire contents of which are incorporated herein by reference.

FIELD

Embodiments described herein relate generally to a semiconductor device.

BACKGROUND

Recently, an IGBT (Insulated Gate Bipolar Transistor) is widely used for a power semiconductor device which has high breakdown voltage and can pass a high electric current. Also, a reverse conducting IGBT which includes the IGBT and a diode in one chip is used in practical. Generally, in power semiconductor device, suppression of switching loss or conduction loss causes decrease of avalanche resistance.

DETAILED DESCRIPTION

Figure 1:
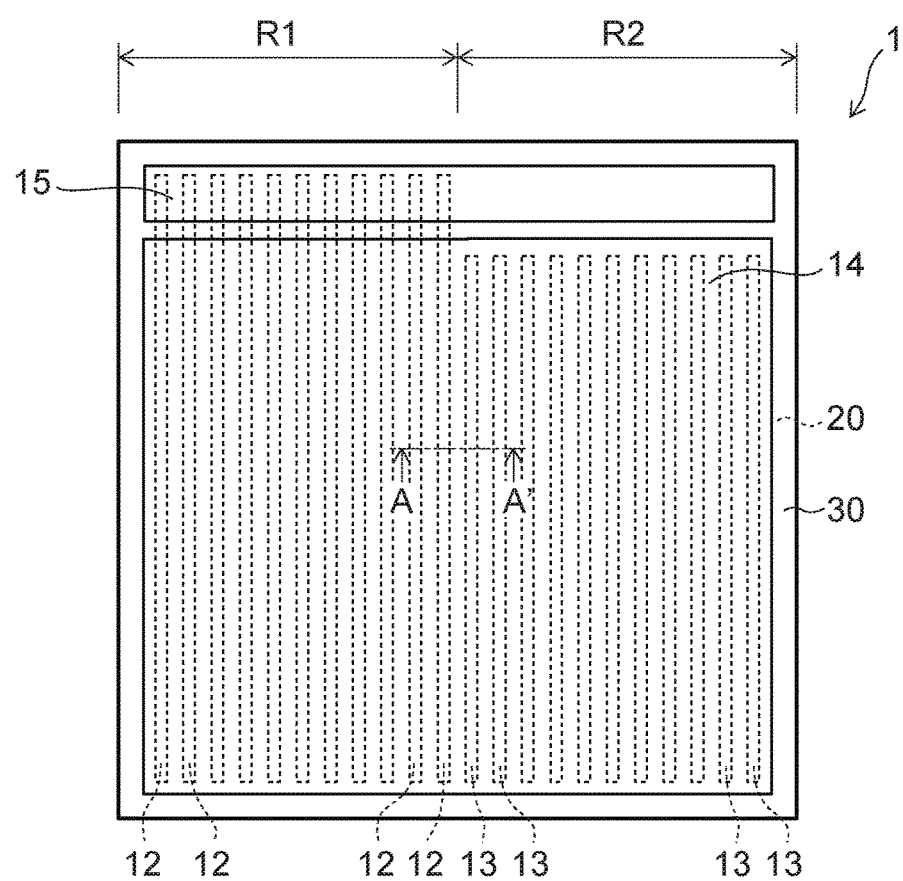
FIG. 1 is a top view of a semiconductor device according to a first embodiment.

According to an embodiment, A semiconductor device includes a first electrode, a first semiconductor layer of a first conductivity type, a second semiconductor layer of a second conductivity type, a third semiconductor layer of the second conductivity type, a fourth semiconductor layer of the second conductivity type, a fifth semiconductor layer of the first conductivity type, a sixth semiconductor layer of the second conductivity type, a second electrode, a third electrode and a fourth electrode. The first semiconductor layer is provided on the first electrode in a first region. The first semiconductor layer is electrically connected to the first electrode. The second semiconductor layer is provided on the first electrode in a second region. The second semiconductor layer is electrically connected to the first electrode. The third semiconductor layer is provided on the first semiconductor layer and the second semiconductor layer. The third semiconductor layer has lower carrier concentration than the second semiconductor layer. The fourth semiconductor layer is provided on the third semiconductor layer. The fourth semiconductor layer has lower carrier concentration than the third semiconductor layer. The fifth semiconductor layer is provided on the fourth semiconductor layer. The sixth semiconductor layer is provided on the fifth semiconductor layer in the first region. The second electrode is provided on the fourth semiconductor layer, the fifth semiconductor layer and the sixth semiconductor layer through a first insulating layer in the first region. The third electrode is provided on the fourth semiconductor layer and the fifth semiconductor layer through a second insulating layer in the second region. The fourth electrode is connected to the fifth semiconductor layer, the sixth semiconductor layer and the third electrode. One of a first distance and a second distance are shorter than a third distance. The first distance is a distance between the third semiconductor layer and the third electrode. The second distance is a distance between the third semiconductor layer and the fifth semiconductor layer in the second region. The third distance is a distance between the third semiconductor layer and the second electrode.

Hereinafter, each embodiment will be described with reference to the accompanying drawings. Also, the drawings are schematic or conceptual, and the relationship between the thickness and width of each portion, the size ratio of the portions, and the like are not necessarily the same as actual values. Further, identical portions may be shown with different dimensions or ratios depending on the drawings.

Also, in this disclosure and the drawings, components substantially similar to those described in one drawing are marked with the same reference numerals in other drawings, and a detailed description may be omitted as appropriate for repeated elements.

First Embodiment

Hereinafter, the embodiments will be described in detail with reference to the accompanying drawings.

Figure 2:
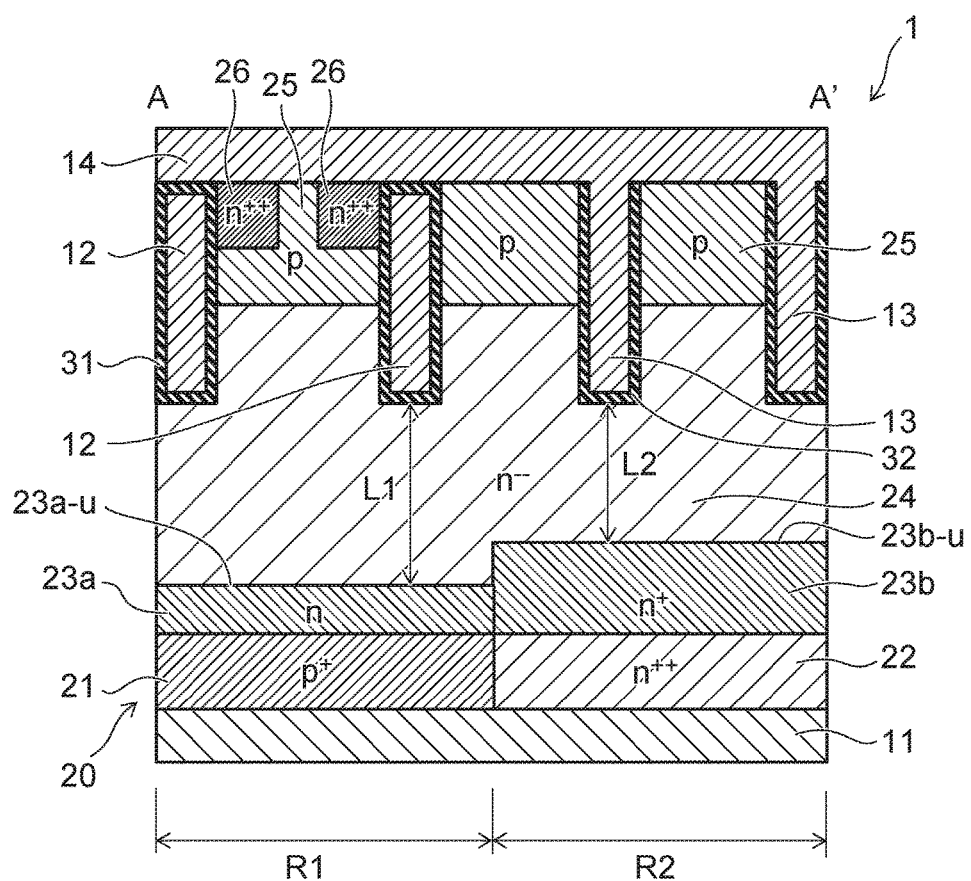
FIG. 2 is a cross-section of the semiconductor device according to the first embodiment.

First, a first embodiment will be described. FIG. 1 is a top view of the semiconductor device according to the first embodiment. FIG. 2 is a cross-section of the semiconductor device according to the first embodiment. The cross-section of FIG. 2 illustrates a cross-section of A-A' line of the FIG. 1.

As illustrated in FIG. 1 and FIG. 2, a semiconductor device 1 of this embodiment is a reverse conducting IGBT which includes an IGBT and a diode. In the semiconductor device 1, an IGBT region R1 and a diode region R2 are provided. From top view of the semiconductor device 1, the IGBT region R1 and diode region R2 are, for example, respectively rectangular.

In the semiconductor device 1, for example, a collector electrode 11 which has flat plate shape and includes metal is provided. The collector electrode 11 is provided undersurface of the semiconductor device 1. A $p^+$ type collector layer 21 and an $n^{++}$ type cathode layer 22 are provided on the collector electrode 11 in parallel. The $p^+$ type collector layer 21 is provided in the IGBT region R1. The $n^{++}$ type cathode layer 22 is provided in the diode region R2. The $p^+$ type collector layer 21 and the $n^{++}$ type cathode layer 22 are connected to the collector electrode 11. A thickness of the $p^+$ type collector layer 21 and the $n^{++}$ type cathode layer 22 are substantially same. The $p^+$ type collector layer 21 and the $n^{++}$ type cathode layer 22 are connected at their edge portion.

In the specification, for example, the term "a $p^+$ collector layer 21" indicates that the conductivity type of the layer is p type. The same applies to the n type. In addition, the superscript "+" and "−" characters represent relatively effective impurity concentration. In other words, with respect to the layer of conductive form is n type, in the order effective impurity concentration is high, the "$n^{++}$ type", "$n^+$ type", "n type", "$n^-$ type", "$n^{--}$ type" notation to. Furthermore, the term "effective dopant concentration" refers to the concentration of the impurities that contribute to the conductivity of the semiconductor material, if a portion includes both impurity which serves as a donor and impurity which serves as an acceptor, the term "effective dopant concentration" indicates the concentration except for their offset amount. "Effective impurity concentration" is equivalent to "carrier concentration". Furthermore, In this specification, "upper", in height, means direction which toward from the corrector electrode 11 to the p$^+$ type corrector layer 21 and n$^{++}$ type cathode layer 22, "lower", in height, means the opposite direction of the "upper" for convenience sake. These directions have no relationship with direction of gravity.

An n type buffer layer 23$a$ is provided on the p$^+$ type collector layer 21. An n$^+$ buffer layer 23$b$ is provided on the n$^{++}$ cathode layer 22. The n type buffer layer 23$a$ and the n type buffer layer 23$b$ are connected. The n type buffer layer 23$b$ is thicker than the n type buffer layer 23$a$. That is, length of the n$^+$ type buffer layer 23$b$ is longer than length of the n type buffer layer 23$a$ in vertical direction. Therefore, height of an upper surface 23$b$-$u$ of the n$^+$ buffer layer 23$b$ is higher than height of an upper surface 23$a$-$u$ of the n type buffer layer 23$a$.

An n$^{--}$ type base layer 24 is provided on both of the n type buffer layer 23$a$ and n$^+$ type buffer layer 23$b$. That is, the n$^{--}$ type base layer 24 extends over the IGBT region R1 and the diode region R2 continually. However, thickness of the n$^{--}$ type base layer 24 in the diode region R2 is thinner than thickness of the n$^{--}$ type base layer 24 in the IGBT region R1 in vertical direction.

A p type base layer 25 is provided on the n$^{--}$ type base layer 24. The p type base layer 25 also extends over both of the IGBT region R1 and the diode region R2. In IGBT region R1, a plurality of n$^{++}$ type emitter layers 26 is provided separately each other on part of the p type base layer 25.

A semiconductor portion 20 is includes the p$^+$ collector layer 21, the n$^{++}$ type cathode layer 22, the n type buffer layer 23, the n$^+$ buffer layer 23$b$, n$^{--}$ type base layer 24, p type base layer 25 and n$^{++}$ type emitter layers 26. The semiconductor portion 20 is made of silicon in which impurity for donor and impurity for acceptor are provided partially and, for example, the silicon is made of single crystal.

In the IGBT region R1, a plurality of trench gate electrodes 12 which extend to one direction are provided in the upper portion of the semiconductor portion 20. The trench gate electrodes 12 penetrate the n$^{++}$ type emitter layers 26 and p type base layer 25 in vertical direction, and bottom portions of the trench gate electrodes 12 are in upper portion of the n$^{--}$ type base layer 24. The trench gate electrodes 12 are formed by poly silicon or metal. For example, gate insulating layers 31 which include silicon oxide or silicon nitride are provided between the trench gate electrodes 12 and the n$^{--}$ type base layer 24, p type base layer 25 and n$^{++}$ type emitter layers 26. Therefore, the trench gate electrodes 12 are insulated from the semiconductor portion 20 through the gate insulating layers 31. The gate insulating layers 31 cover top surface of the trench gate electrodes.

On the other hand, in the diode region R2, a plurality of trench emitter electrodes 13 is provided in an upper portion of the semiconductor portion 20. The trench emitter electrodes 13 extend to the same direction as the trench electrodes 12. The trench emitter electrodes 13 penetrate the p type base layer 25 in vertical direction, and bottom portions of the trench emitter electrodes 13 are in upper portion of the n$^{--}$ type base layer 24. The trench emitter electrodes 13 are formed by, for example, poly silicon or metal. Insulating layers 32 which include silicon oxide or silicon nitride are provided between the trench emitter electrodes 13 and the n$^{--}$ type base layer 24, p type base layer 25 and n$^{++}$ type emitter layers 26.

An emitter electrode 14, for example plane shape, is provided above the semiconductor portion 20, the trench gate electrodes 12 and the trench emitter electrodes 13. The emitter electrodes 14, for example, made of metal. The emitter electrode 14 is connected to the trench emitter electrodes 13. Here, when the trench emitter electrodes 13 are made of metal, it is possible that the trench emitter electrodes 13 and the emitter electrodes 14 are formed in unity. The emitter electrode 14 is connected to the p type base layer 25 an n$^{++}$ type emitter layers 26. On the other hand, since a part of the gate insulating layers 31 is disposed between the emitter electrode 14 and the trench gate electrodes 12, the emitter electrode 14 is not connected to the trench gate electrodes 12.

As illustrated in FIG. 1, a gate electrode 15 is provided above the semiconductor portion 20 and the trench gate electrodes 12 in one edge portion of the IGBT region R1. The trench gate electrodes 12 are connected to the gate electrode 15 at one edge portion of longitudinal direction of the trench gate electrodes 12. The gate electrode 15 faces the emitter electrode 14 through some space. In top view, an area of the emitter electrode 14 is bigger than that of the gate electrodes 15. A passivation film 30 is provided on an area where the emitter electrode 14 and the gate electrode 15 are not provided on the semiconductor portion 20.

In this embodiment, since the surface 23$b$-$u$ is higher than the surface 23$a$-$u$, a distance L2 between the n$^+$ type buffer layer 23$b$ and the trench emitter electrodes 13 in the diode region R2 is shorter than a distance L1 between the n type buffer layer 23$a$ and the trench gate electrodes 12 in IGBT region R1.

Next, an effect of this embodiment is described.

The semiconductor device 1 in this embodiment, in IGBT region R1, an IGBT which has a pnpn structure is formed. The IGBT includes the corrector electrode 11, the P$^+$ type corrector layer 21, n type buffer layer 23$a$, n$^{--}$ type base layer 24, p type base layer 25, n$^{++}$ type emitter electrode 26, the emitter electrode 14, the trench gate electrodes 12 and the gate insulating layers 31. And it is possible that an electric current which flows from the corrector electrode 11 to the emitter electrode 14 may be controlled by controlling a voltage of the trench gate electrodes 12 through the gate electrode 15. In the IGBT region R1, in off-states, a low concentration portion may assure breakdown voltage. The low concentration portion is between the n type buffer layer 23$a$ in n$^{--}$ type base layer 24 and the trench gate electrodes 12. A thickness of the low concentration portion is the distance L1.

In the diodes region R2, an n type portion includes n$^{++}$ cathode layer 22, n$^+$ type buffer layer 23$b$ and n$^{--}$ type base layer 24. A p type portion includes p type base layer 25. Then, the n type portion and the p type portion compose a pn diode. The pn diode cuts off electric current which flows from the corrector electrode 11 to the emitter electrode 14. The pn diode passes electric current which flows from the emitter electrode 14 to the corrector electrode 11. That is, the corrector electrode 11 may operate as a cathode electrode, and the emitter electrode 14 and the trench emitter electrodes may operate as an anode electrode. In the diode region R2, when reverse bias voltage is applied, a low concentration portion which may assure breakdown voltage is between the n$^+$ type buffer layer 23$b$ in n$^{--}$ type base layer 24 and the trench emitter electrodes 13. A thickness of the low concentration portion is the distance L2.

In this embodiment, since the distance L2 is shorter than the distance L1, the breakdown voltage of the diode region R2 is lower than that of the IGBT region R1. Thus, when overvoltage, in which the corrector electrode is positive electrode and the emitter electrode is negative electrode, is applied, avalanche breakdown may be occurred in the diode region R2 before occurred in the IGBT region R1. Once the avalanche breakdown occurred in the diodes region R2, the voltage may be released. And the avalanche breakdown in the IGBT region R1 may be avoidable. Thus, high avalanche resistance, in the semiconductor device 1, may be possible.

On the other hand, if the avalanche breakdown is occurred in the IGBT region R1, a parasitic pnp bipolar transistor which includes the p type base layer 25, n type buffer layer 23a, $n^{--}$ type base layer 24 and $p^+$ type corrector layer 21 may be turn ON in partially, and electric current may flow the pnp bipolar transistor intensively. As a result, the IGBT region R1 may be broken down. On the other hand, since there is no parasitic pnp bipolar transistor in the diode region R2, when avalanche break down occurred in the diode region R2, electric current may not induced by the parasitic pnp bipolar transistor. Therefore, the diode region R2 is hard to be broken down. Thus, according to this embodiment, highly reliable semiconductor device may be realized.

Second Embodiment

Figure 3:
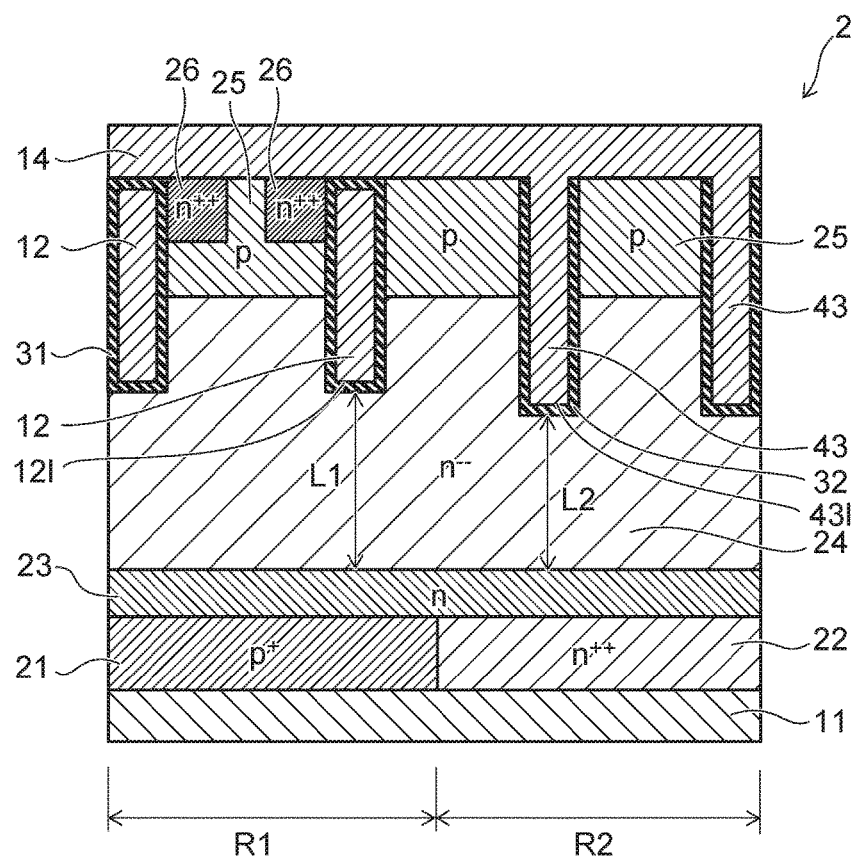
FIG. 3 is a cross-section of a semiconductor device according to a second embodiment.

Next, second embodiment will be described as follows. FIG. 3 is a cross-section of a semiconductor device according to this embodiment. The cross-section of FIG. 3 corresponds to the A-A' line cross-section of the FIG. 1.

As illustrated in FIG. 3, in a semiconductor device 2 of this embodiment, a single n type buffer layer 23 is provided over the IGBT region R1 and the diode region R2 instead of the n type buffer layer 23a and the $n^+$ type buffer layer 23b in the semiconductor element 1 of the first embodiment.

Trench emitter electrodes 43 are longer than the trench gate electrodes 12 in vertical direction. That is, bottom portions 431 of the trench emitter electrodes 43 are lower than bottom portions 121 of the trench gate electrodes 12. Therefore, distance L2 between the n type buffer layer 23 and the trench emitter electrodes 43 is shorter than the distance L1 between the n type buffer layer 23 and the trench gate electrodes 12.

Also, in this embodiment, since the distance L2 which assure breakdown voltage in the diodes region R2 is shorter than the distance L1 which assure breakdown voltage in IGBT region R1, breakdown voltage in diode region R2 is lower than that of in IGBT region R1. Other function and effect is the same as the first embodiment.

Third Embodiment

Figure 4:
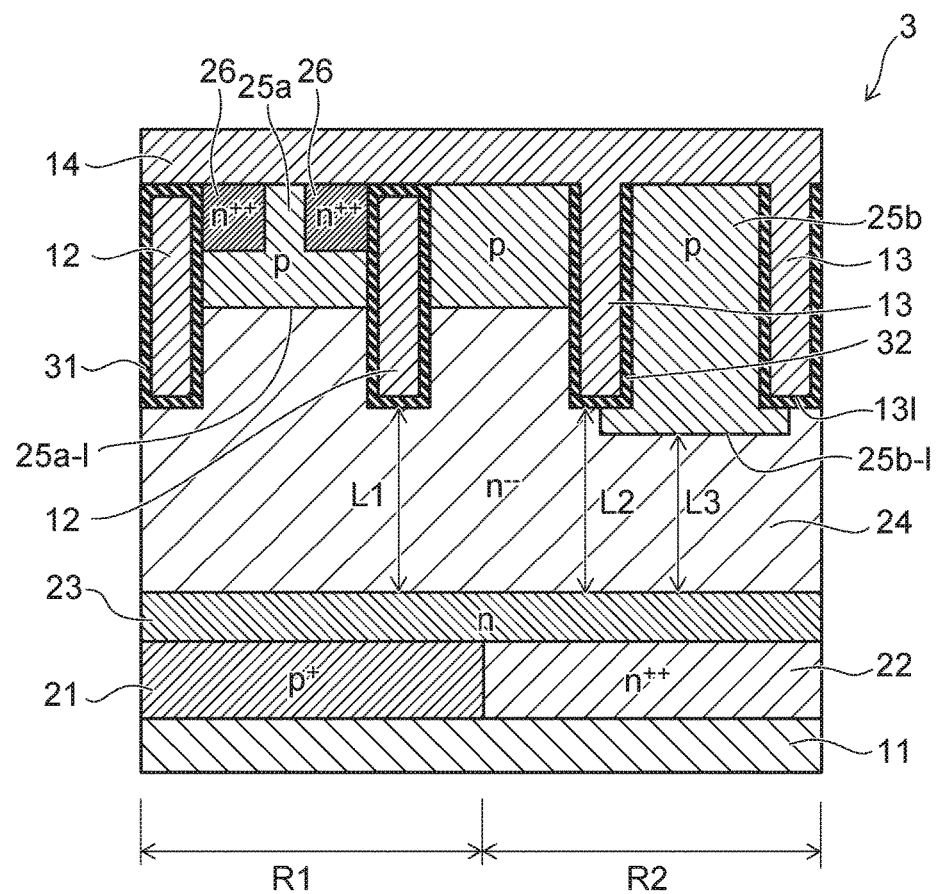
FIG. 4 is a cross-section of a semiconductor device according to a third embodiment.

Next, third embodiment will be described as follows. FIG. 4 is a cross-section of a semiconductor device according to this embodiment. The cross-section of FIG. 4 corresponds to the A-A' line cross-section of the FIG. 1.

As illustrated in FIG. 4, in a semiconductor device 3 of this embodiment, same as the second embodiment, a single n type buffer layer 23 is provided over the IGBT region R1 and the diode region R2 instead of the n type buffer layer 23a and the $n^+$ type buffer layer 23b in the semiconductor element 1 of the first embodiment. In this embodiment, thickness of a p type base layer 25a in the IGBT region R1 and thickness of a p type base layer 25b in the diode region R2 is different. The thickness of the p type base layer 25b is thicker than the thickness of the p type base layer 25a.

Therefore, bottom edge 25b-1 of the p type base layer 25b is lower than bottom edge 25a-1 of the p type base layer 25a. And the bottom edge 25b-1 is lower than the bottom edge 131 of the trench emitter electrode 13.

Therefore, in the diodes region R2, distance L3 between the n type buffer layer 23 and the p type base layer 25b is shorter than the distance L2 between the n type buffer layer 23 and the trench emitter electrodes 13. Therefore, when reverse bias voltage is applied in the diode region R2, the breakdown voltage is depend on the distance L3 rather than the distance L2. And the distance L3 is shorter than the distance L1.

In this embodiment, since the distance L3 which assures breakdown voltage in the diode region R2 is shorter than the distance L1, the breakdown voltage of the diode region R2 is lower than that of IGBT region R1. Therefore, avalanche breakdown may be occurred in the diode region R2 before occurred in the IGBT region R1. And avalanche breakdown in the IGBT region R1 may be avoidable. Thus, in the semiconductor device 3, high avalanche resistance may be possible. Other function and effect is the same as the first embodiment.

Fourth Embodiment

Figure 5:
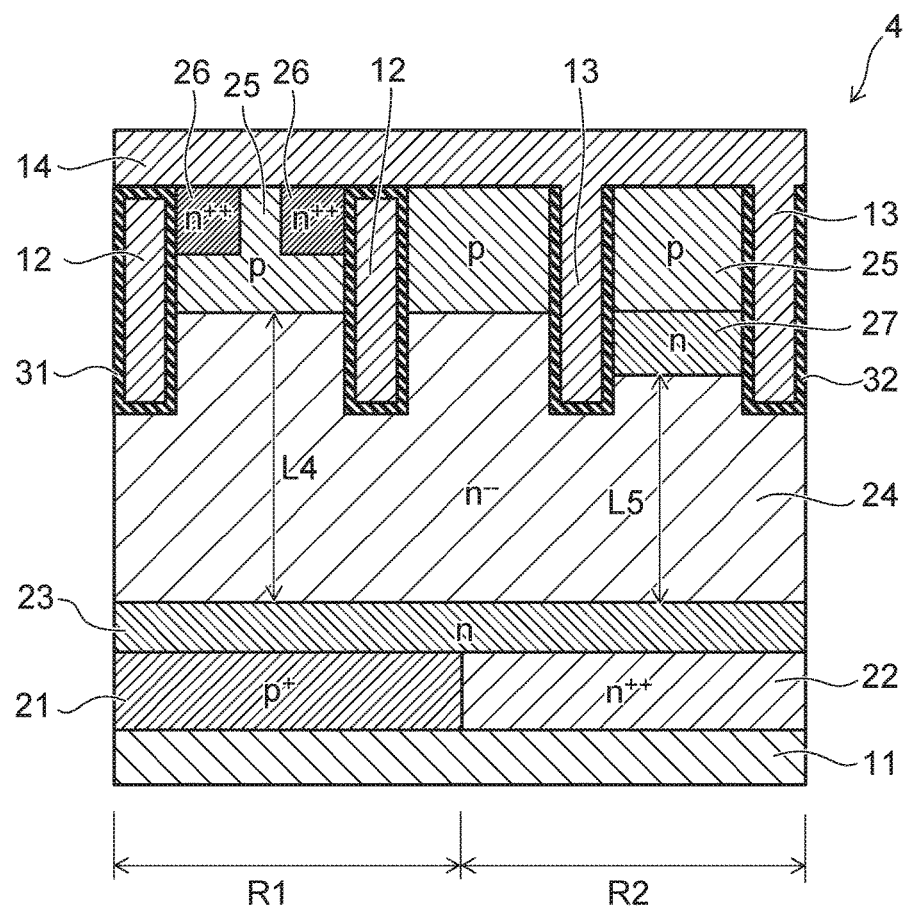
FIG. 5 is a cross-section of a semiconductor device according to a force embodiment.

Next, fourth embodiment will be described as follows. FIG. 5 is a cross-section of a semiconductor device according to this embodiment. The cross-section of FIG. 5 corresponds to the A-A' line cross-section of the FIG. 1.

As illustrated in FIG. 5, in a semiconductor device 4 in this embodiment, same as the second embodiment, a single n type buffer layer 23 is provided over the IGBT region R1 and the diode region R2. And an n type barrier layer 27 is provided between the $n^{--}$ type base layer 24 and the p type base layer 25 in the diode region R2. Effective impurity concentration of the n barrier layer 27 is higher than that of the $n^{--}$ type base layer 24.

In this embodiment, since the n type barrier layer is provided in the diode region R2, thickness of the $n^{--}$ type base layer 24 in the diode region R2 is distance L5 between the n type buffer layer 23 and n type barrier layer 27. Since the $n^{--}$ type base layer 24 is a low concentration portion which assures breakdown voltage, the shorter the thickness of the $n^{--}$ type base layer 24, that is the distance L5, is, the lower the breakdown voltage in the diode region R2. On the other hand, thickness of the $n^{--}$ type base layer 24 in the IGBT region R1 is distance L4 between the n type buffer layer 23 and p type base layer 25. The shorter the distance L4 is, the lower the breakdown voltage in the IGBT region R1. In this embodiment, since the distance L5 is shorter than the distance L4, breakdown voltage in the diode region R2 is lower than that of in the IGBT region R2.

Other function and effect is the same as the first embodiment.

Fifth Embodiment

Figure 6:
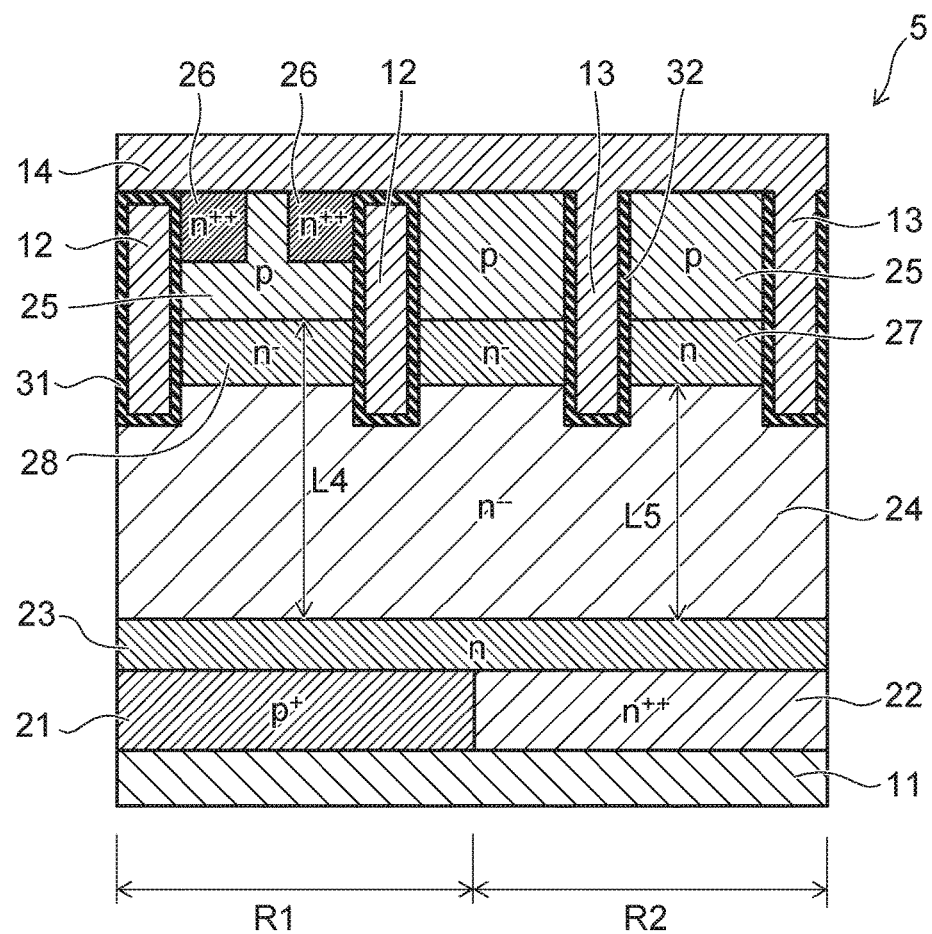
FIG. 6 is a cross-section of a semiconductor device according to a fifth embodiment.

Next, fifth embodiment will be described as follows. FIG. 6 is a cross-section of a semiconductor device according to this embodiment. The cross-section of FIG. 6 corresponds to the A-A' line cross-section of the FIG. 1.

As illustrated in FIG. 6, in a semiconductor device 5 of this embodiment, compare to the fourth embodiment (refer to the FIG. 5), a $n^-$ type barrier layer 28 is provided between the $n^{--}$ type base layer 24 and the p type base layer 25 in the IGBT region R1. The effective impurity concentration of the $n^-$ type barrier layer 28 is lower than n type barrier layer 27.

In this embodiment, the n⁻ type barrier layer 28 and n⁻⁻ type base layer 24 assure breakdown voltage with together as the low concentration portion. That is, same as the forth embodiment, the distance L5 which assures breakdown voltage in the diode region R2 is shorter than the distance L4 which assures breakdown voltage in the IGBT region R1. Therefore, avalanche breakdown may be occurred in the diode region R2 before occurred in the IGBT region R1. And avalanche breakdown in the IGBT region R1 may be avoidable. Thus, in the semiconductor device 5, high avalanche resistance may be possible.

Other function and effect is the same as the fourth embodiment.

These embodiments described above provide a semiconductor device designed to increase avalanche resistance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure. Additionally, the embodiments described above can be combined mutually.

What is claimed is:

1. A semiconductor device, comprising:
   a first electrode;
   a first semiconductor layer of a first conductivity type, provided on the first electrode in a first region, and electrically connected to the first electrode;
   a second semiconductor layer of a second conductivity type, provided on the first electrode in a second region, and electrically connected to the first electrode, the second conductivity type being different from the first conductivity type;
   a third semiconductor layer of the second conductivity type, provided on the first semiconductor layer and the second semiconductor layer, having lower carrier concentration than the second semiconductor layer;
   a fourth semiconductor layer of the second conductivity type, provided on the third semiconductor layer, having lower carrier concentration than the third semiconductor layer;
   a fifth semiconductor layer of the first conductivity type, provided on the fourth semiconductor layer;
   a sixth semiconductor layer of the second conductivity type, provided on the fifth semiconductor layer in a part of the first region;
   a seventh semiconductor layer of the second conductivity type, provided between the fourth semiconductor layer and the fifth semiconductor layer in the second region, having higher carrier concentration than the fourth semiconductor layer, the seventh semiconductor layer being not provided in the first region;
   a second electrode, provided on the fourth semiconductor layer, the fifth semiconductor layer and the sixth semiconductor layer through a first insulating layer in the first region;
   a third electrode, provided on the fourth semiconductor layer, the seventh semiconductor layer and the fifth semiconductor layer through a second insulating layer in the second region; and
   a fourth electrode, connected to the fifth semiconductor layer, the sixth semiconductor layer and the third electrode.

2. The semiconductor device according to claim 1, further comprising an eighth semiconductor layer of the second conductivity type, provided between the fourth semiconductor layer and the fifth semiconductor layer in the first region, having lower carrier concentration than the seventh semiconductor layer.

* * * * *